United States Patent [19]

Goossen et al.

[11] Patent Number: 5,443,685
[45] Date of Patent: Aug. 22, 1995

[54] COMPOSITION AND METHOD FOR OFF-AXIS GROWTH SITES ON NONPOLAR SUBSTRATES

[75] Inventors: Keith W. Goossen, Aberdeen; James A. Walker, Howell, both of N.J.

[73] Assignee: AT&T Corp., Murray Hill, N.J.

[21] Appl. No.: 146,511

[22] Filed: Nov. 1, 1993

[51] Int. Cl.⁶ .................... H01L 21/306; B44C 1/22
[52] U.S. Cl. .................... 156/635.1; 437/90; 437/234; 117/97
[58] Field of Search ............ 156/635, 643, 657, 662; 437/90, 91, 234; 117/106, 103, 92, 97, 90, 84; 257/588

[56] References Cited

U.S. PATENT DOCUMENTS

| | | | |
|---|---|---|---|
| 3,476,592 | 11/1969 | Berkenblit et al. | 117/201 |
| 4,911,783 | 3/1990 | Voboril | 156/643 |
| 5,248,385 | 9/1993 | Powell | 117/97 X |
| 5,363,800 | 11/1994 | Larkin et al. | 117/97 |

FOREIGN PATENT DOCUMENTS 0286855 4/1987 European Pat. Off. .
0503211A1 9/1992 European Pat. Off. .

OTHER PUBLICATIONS

Fischer et al., "Growth and Properties of GaAs/AlGaAs on Nonpolar Substrates Using Molecular Beam Epitaxy," J. Appl. Phys. 58(1), (1985) at 374–81.
Biegelsen et al., "Heteroepitaxial Growth of Polar Semiconductors on Non-Polar Substrates," Mat. Sci. Eng. B14(3), (1992) at 317–331.
Harris et al., "The Nucleation and Growth of GaAs on Si," Mat. Res. Soc. Symp. Proc., vol. 91, (1987) at 3–14.
Tran et al., "Growth and Characterization of InP on Silicon by MOCVD," J. Crys. Grwth. 121(3), (1992) at 365–72.
Sporken et al., "Molecular Beam Epitaxy of CdTe on Large Area Si<100>," J. Vac. Sci. Tech. B 9(3), (1991) at 1651–1655.
Chung et al., "The Effects of Low-Angle Off-Axis Substrate Orientation on Mosfet Performance and Reliability," IEEE Trans. Electr. Dev. 38(3), (1991) at 627–33.
Sakai et al., "MOCVD Growth Of III–V Compounds On Si Using Strained Superlattices," Mat. Res. Soc. Symp. Proc. vol. 67, (1986) at 15–27.
D. R. Purdy, "Fabrication of Complex Micro-Optic Components Using Halftone Transmission Masks to Photosculpt Positive Resist," EOS Top. Mtg. Dig. S., vol. 2, (1993).
Hisanga et al., "Fabrication of 3-Dimensionally Shaped Si Diaphragm Dynamic Focusing Mirror," Proc. IEEE Micro. Electro. Mech. Sys., (1993) at 30–35.
"Innovations: The Finest Gray Scale Yet," IEEE Spectrum, (Oct. 1993) at 68.
Masselink et al., "Optical Properties of GaAs on <100> Si Using Molecular Beam Epitaxy," J. Appl. Phys. Lett., 45(12), (1984) at 1310.
M. Hisanga, T. Koumura, T. Hattori, "Fabrication of 3-Dimensional Shaped Si Diaphragm Dynamic Focusing Mirror," Proceedings of IEEE Micro Electro Mechanical Systems, 7 Feb. 1993, pp. 30–35.

*Primary Examiner*—William Powell

[57] ABSTRACT

Nonpolar substrates comprising off-axis growth regions for the growth of polar semiconductors, and a method for making such substrates, are disclosed. According to the invention, an erodible material, such as a photoresist, is applied to a substrate at a site and is exposed to radiation at that site which has an linear variation in energy at the surface of the erodible material. Due to this variation in exposure energy, a taper results in the erodible material after development. The tapered region is then etched in a manner which etches both the erodible layer and the underlying substrate. The taper in the erodible layer provides a varying attenuation during the etching process such that the taper of the erodible layer is transferred to the substrate.

47 Claims, 2 Drawing Sheets

COMPOSITION AND METHOD FOR OFF-AXIS GROWTH SITES ON NONPOLAR SUBSTRATES

FIELD OF THE INVENTION

This invention relates to surface preparation of nonpolar wafers to facilitate epitaxial growth of polar semiconductors.

BACKGROUND OF THE INVENTION

Growing polar semiconductors, such as III–V and II–VI compound semiconductors, on nonpolar substrates, such as silicon (Si) or germanium (Ge), is desirable for the implementation of a variety of integrated electronic and optical applications. Such applications include, for example, optical interconnects between integrated circuit chips, optical computing and photonic switching.

It is, however, difficult to grow compound semiconductors on nonpolar substrates. The principal reason for this difficulty is that there are no preferential bonding sites for initial growth on the nonpolar substrate for the cations and anions of the compound semiconductor. As a result, some growth may begin in the cation plane, and some in the anion plane. This is referred to as antiphase disorder. Further, differences in the lattice structure of certain semiconductors, such as gallium arsenide (GaAs) and Si, for example, present an additional impediment to satisfactory growth. Antiphase disorder and lattice mismatch may result in both structural and electrically active defects.

The difficulty with growing compound semiconductors, in particular GaAs, on nonpolar substrates, has been addressed in the prior art See Fischer et al., "Growth and Properties of GaAs/AlGaAs on Nonpolar Substrates Using Molecular Beam Epitaxy," J. Appl. Phys. 58(1) at 374–81 (1985); Biegelsen et al., "Heteroepitaxial Growth of Polar Semiconductors on Non-Polar Substrates," Mat. Sci. Eng. B14(3) at 317–331 (1992); Harris et al., "The Nucleation and Growth of GaAs on Si, " Mat. Res. Soc. Symp. Proc., Vol. 91 at 3–14 (1987); Tran et al., "Growth and Characterization of InP on Silicon by MOCVD," J Crys. Grwth. 121(3) at 365–72 (1992); Sporken et al., "Molecular Beam Epitaxy of CdTe on Large Area Si<100>," J Vac. Sci. Tech. B 9(3) at 1651–55 (1991). All articles referenced in this specification are incorporated herein by reference.

One approach for growing compound semiconductors on nonpolar substrates is to angle or tilt the substrate off the standard <100> orientation. See Harris et al. The designation "<100>" is known as a Miller indice. It may be used to describe the orientation of a planar surface. The <100> surface refers to a surface which lies along a face of a cubic lattice structure, and this is the standard orientation for substrates such as silicon. However, there are problems associated with using "off-axis" silicon substrates for integrated electronics. In particular, it has been found that device performance of metal oxide semiconductor (MOS) transistors formed in off-axis wafers is affected by this surface orientation. See Chung et al , . "The Effects of Low-Angle Off-Axis Substrate Orientation on Mosfet Performance and Reliability," IEEE Trans. Electr. Dev. 38(3) at 627-33 (1991).

Others have explored the use of superlattice buffer layers to minimize lattice mismatch between the substrate and the compound semiconductor. To achieve growth of GaAs on Si, Sakai et al., Mater. Res. Soc. Symp. Proc., Vol. 67 at 15 (1986) used a series of layers, beginning with a GaP layer that is lattice matched to Si, then deposited successive GaP/GaAsP and GaAsP/GaAs superlattice layers. Testing of devices, such as a laser, formed utilizing superlattice buffered GaAs/Si suggests that significant defects are still present. See Harris et al.

Accordingly, there is a need for a method to grow polar semiconductors on a standard orientation <100>, nonpolar substrate.

SUMMARY OF THE INVENTION

The foregoing problems are solved by the present invention which provides a method for obtaining off-axis growth sites on standard orientation nonpolar substrates. According to a first embodiment of the invention, a standard <100> wafer with existing electronic structure is etched, at discrete locations, through the dielectric films down to the substrate surface. A film of erodible material such as photoresist or photo-definable polyimide is then applied to the wafer surface. The intended growth regions are then exposed to radiation which has an energy variation at the surface of the erodible material. This results in an angular taper in the material in the intended growth regions. The profile of the erodible material is transferred to the underlying substrate by use of an etcher, obtaining an off-axis growth site ready for compound semiconductor epitaxy.

Further features of the invention, its nature and advantages will be apparent from the drawings and the following detailed description of the invention.

DETAILED DESCRIPTION

Figure 1:
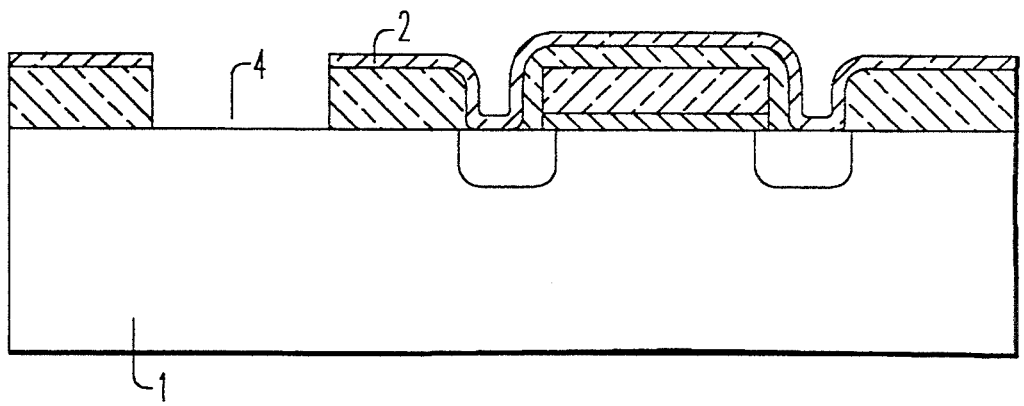
FIG. 1 is an illustration of a MOS structure formed on a standard substrate with a growth site opened through the MOS dielectric film.

FIG. 1 is an illustration of a standard <100> nonpolar wafer 1 with existing MOS structure 2 (without metallization) which has been selectively etched through the MOS dielectric films down to substrate surface 4. Any means for etching through the films is acceptable. Examples include, but are not limited to, reactive ion etching, plasma ion etching, ion milling and wet chemical etching.

Figure 2:
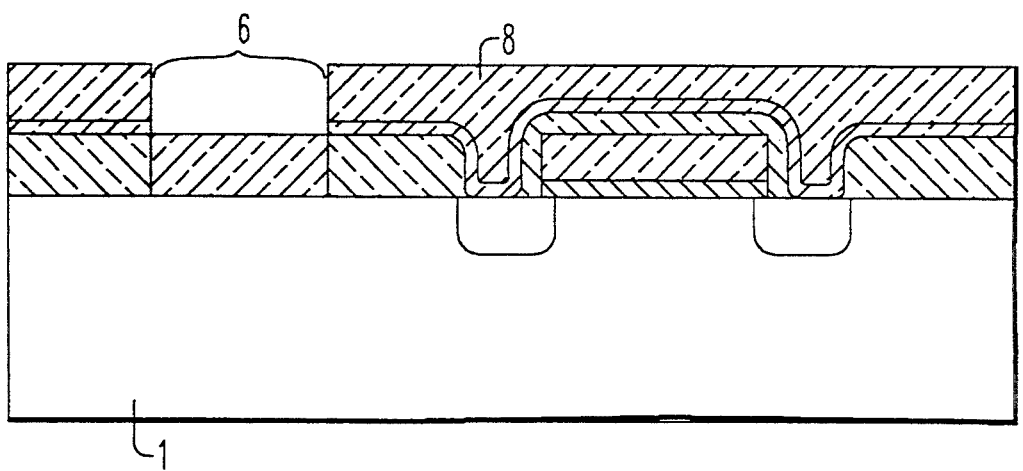
FIG. 2 is an illustration of the wafer of FIG. 1 after application of a film of erodible material.

After opening one or more growth sites 6, the sites at which compound semiconductor growth is contemplated, a film of selectively erodible material 8 is applied to the wafer surface, as illustrated in FIG. 2. Suitable erodible materials include, but are not limited to, photoresists and photo-definable polyimide. The erodible material is characterized by a change in solubility upon exposure to appropriate radiation, typically ultraviolet light, although x-rays or electron beams may be used with certain materials. Exposure may increase or decrease solubility depending upon the nature of the erodible material.

Figure 3:
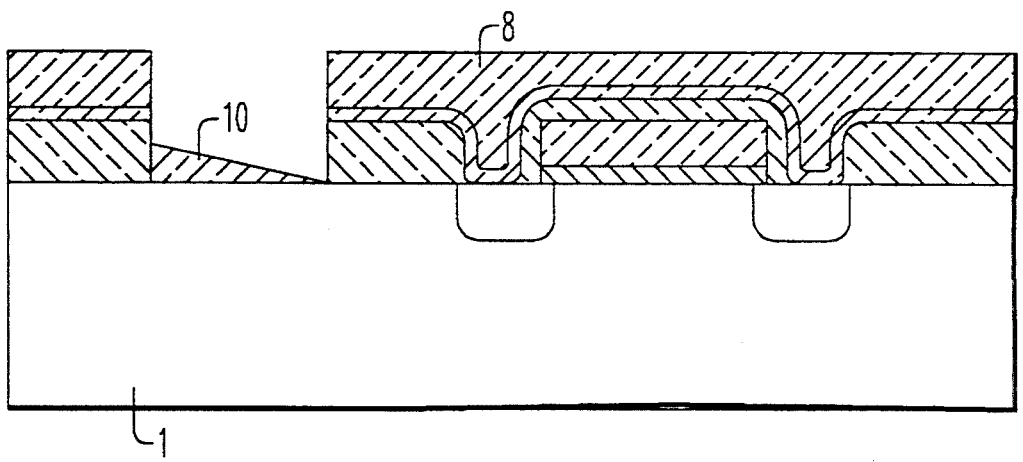
FIG. 3 is an illustration of the wafer of FIG. 1 after the film of erodible material has been selectively exposed and developed.

The erodible material 8 covering the intended compound semiconductor growth region or regions 6 is then exposed to radiation. The radiation is applied so that it has an energy variation at the surface of the portion of the erodible material in the intended growth region 6. After exposure, the erodible material is then treated with a solvent that removes erodible material of higher solubility. This is referred to as "development." After development, an angular taper 10 in the intended growth region 6 results as illustrated in FIG. 3.

To achieve the energy variation discussed above, the halftone, de-focused techniques described by D. R. Purdy, "Fabrication of Complex Micro-Optic Components Using Halftone Transmission Masks to Photosculpt Positive Resist," EOS Top. Mtg. Dig S., Vol. 2 (1993) and Hisanaga et al., "Fabrication of 3-Dimensionally Shaped Si Diaphragm Dynamic Focusing Mirror," Proc. IEEE Micro. Electro. Mech. Sys. at 30–35 (1993) may suitably be used. These techniques involve developing a photomask with a predetermined variation in gray scale levels. When photoresist is exposed through such a mask, the variation in energy transmission will result in a complementary variation in the depth to which the resist is exposed. Focus is adjusted to introduce a degree of blur so that the digitized nature of the photomask will not be reproduced, resulting in a smooth surface at the photoresist.

Figure 4:
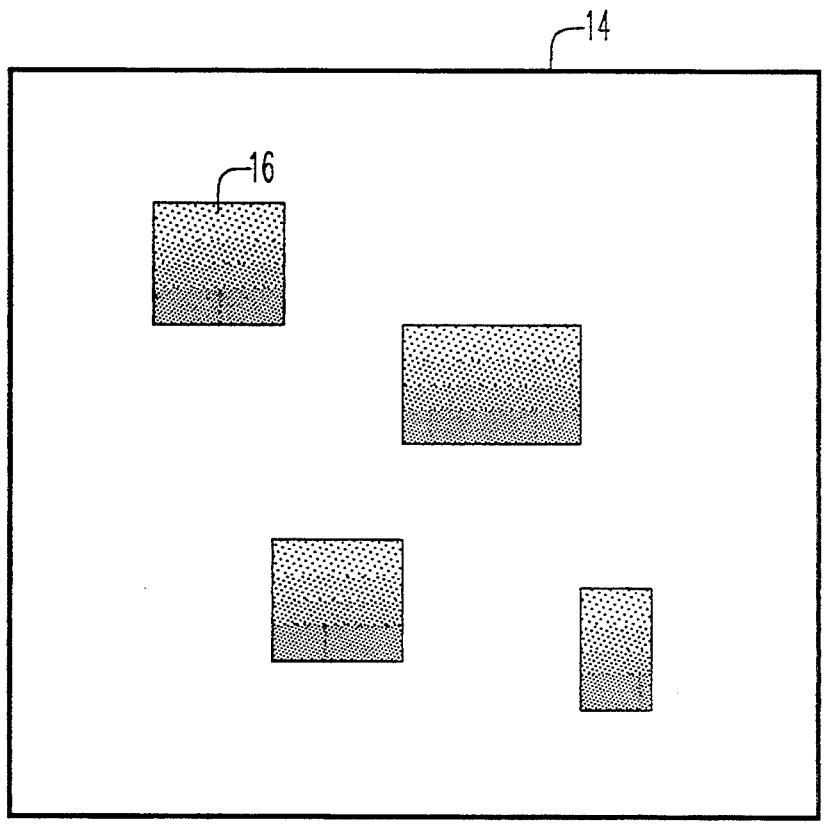
FIG. 4 is an illustration of a photomask with linearly graded regions for attenuation of optical energy.

Another approach is to use a photomask 14 with linearly graded regions 16, as shown in FIG. 4. The photomask 14 illustrated in FIG. 4 would provide the linearly varying attenuation necessary to form four off-axis growth regions, though such masks may be designed to provide any number of such regions in any suitable orientation. The linearly graded regions may be formed by a thin film of chromium or iron oxide of appropriately increasing or decreasing particle density. In a presently preferred embodiment, a thin film of inconel is used to create a photomask according to a process developed by Oxford Computer Inc., in Oxford, Conn. Film thickness is varied to achieve a linear variation in the energy incident upon the erodible material, resulting in the tapered profile 10 as shown in FIG. 3 and discussed above.

In a third method for obtaining the tapered profile, which will be referred to as the scanned slit method, a photomask comprising a slit of small width is positioned over the portion of the substrate coated with erodible material. The mask or substrate is held by a motorized micropositioner. As radiation is directed at the erodible material, the slit is scanned along the wafer, or vice versa, for the distance desired to form the exposed area. The rate at which the scanning occurs is varied to change the amount of energy incident upon any particular section of the desired area. The amount of erodible material remaining after exposure and subsequent development is directly dependent upon the amount of energy to which it was exposed. Thus, as energy is varied linearly along the desired area, a taper or linear wedge 10 of erodible material will result as illustrated in FIG. 3.

A fourth method for obtaining a tapered profile in the erodible material is known as E-beam lithography. This method involves the use of a scanning electron (E) beam. In this method, a suitably programmed E-beam writer is scanned along the width of the intended growth region. A number of scanning passes are made across the width of the region, where, after each pass, the beam is indexed along the length of the intended growth region. Thus, each scan is performed at a slight lengthwise displacement from the previous scan. In this manner, the full area of the intended growth region is sequentially exposed. As the E-beam is indexed along the length of the region, the energy of the beam is varied as required to alter the exposure depth to provide the desired taper.

While the taper in the erodible material can be achieved by the aforementioned lithographic methods, any suitable means or method for achieving such taper may be used and is within the contemplated scope of this invention. It being recognized that other methods may readily occur to those skilled in the art in view of the teachings of the present invention.

Figure 5:
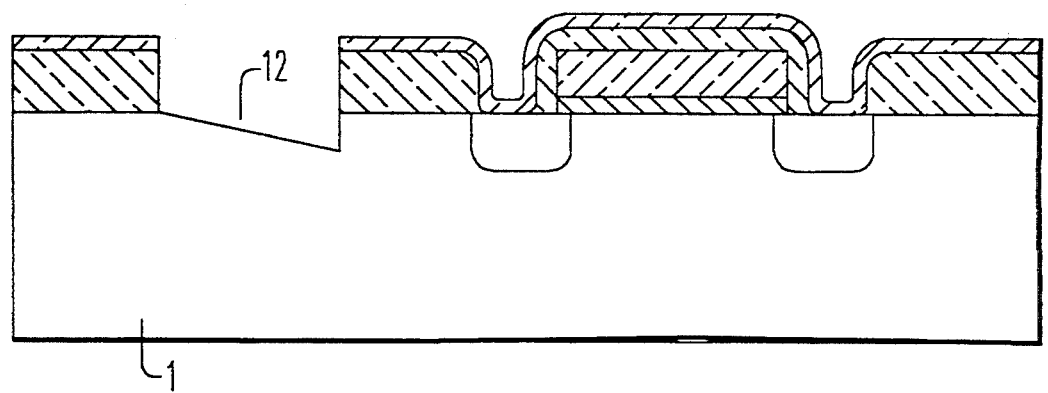
FIG. 5 is an illustration of the wafer after etching, showing an off-axis site ready for compound semiconductor growth.

Having obtained the taper 10 in the erodible layer, as shown in FIG. 3, the wafer is then etched under conditions which etch both the erodible material and the substrate. In typical photolithographic applications, the erodible layer remaining after development protects underlying layers from the etchant, i.e., the erodible layer is not etched. However, in the present invention, the erodible layer is etched as well as the substrate. This etching results in a tapered or angled off-axis growth site 12 on the substrate wafer, as illustrated in FIG. 5. The erodible material acts as a sacrificial mask which provides a variable attenuation according to its taper in order to transfer the desired shape or angle into the underlying substrate. Reactive ion etching, plasma ion etching, ion milling, wet chemical etching or any other method or means suitable for etching both layers may be used. While not practiced as often as the standard photolithographic method, etching both layers, as described above, is also well known to those skilled in the art.

With regard to the desired taper angle of the growth site 12, prior art studies have determined preferred angles for compound semiconductor growth on nonpolar substrates such as silicon and germanium. For example, for GaAs epitaxial growth, a substrate taper of about $\frac{1}{4}°$ to 5° is recommended, and a 3° taper is most preferred See Masselink et al., "Optical Properties of GaAs on <100> Si Using Molecular Beam Epitaxy," J. Appl. Phys. Lett., 45(12) at 1310 (1984); Harris et al. and references cited therein. As to other III–V compound semiconductors, Tran et al. report that good quality InP on Si can be grown on 3° off-axis substrate. Sporken et al. found 6° to 8° off-axis silicon preferable for the II–VI compound CdTe. In all cases, the angle of the taper refers to the angle subtended by the surface of the taper and the <100> surface, and the taper is towards the <110> surface.

The required angle of taper 10 of the erodible material is determined by the relative etch rates of the erodible material and the substrate, and the desired taper of the growth region. Thus, if the etch rates of the erodible material and the substrate are identical, the desired taper in the erodible material would be 3° in order to obtain a 3° off-axis substrate surface. If the etch rates are not identical, the taper of the erodible material would differ from 3° as a function of the relative etch rates. In this manner, one or more off-axis sites of the same or differing taper angle can be created to provide growths sites for one or more of the same or different compound semiconductors.

The present method has been discussed in the context of wafers with existing MOS structure. However, it is applicable to wafers with any type structure (formed in any suitable manner), including, but not limited to bipolar transistors, and heterojunction bipolar transistors. Further, the aforementioned invention describes creating off-axis growth regions subsequent to the creation of first level electronics and prior to metallization. This is due to the fact that the current state of the art for GaAs growth requires temperatures above the melting point of MOS metallurgy. As GaAs growth methods with lower growth temperatures are developed, or as other metals with sufficiently high melting points are used for metallization, the growth regions can be created subsequent to metallization of first level electronics. To the extent that growth methods for other compound semiconductors or other applications presently allow growth after metallization, such embodiments are within the contemplated scope of this invention. It is therefore understood that the present invention is not intended to be limited to preparing growth sites prior to metallization. Further, growth regions can be created prior to the creation of first level electronics. If this is the case, then the initial etching step to remove the dielectric films is not required.

After the off-axis growth sites are created in the substrate wafer, compound semiconductors can be grown at such sites by any method known to those skilled in the art. Such methods include, but are not limited to, molecular beam epitaxy, chemical beam epitaxy, organometallic chemical vapor deposition (OMCVD), vapor phase epitaxy and liquid phase epitaxy.

Tapered surfaces according to the present invention are useful for a variety of applications, such as the those disclosed in our copending application entitled "Arbitrary Angle Mirrors in Substrates for use in Hybrid Optics Systems," filed on even date herewith. The specification of the above referenced application is incorporated herein by reference.

We claim:

1. A method of treating the surface of a nonpolar substrate comprising the steps of:
   (a) providing a taper in an erodible material which has been applied to a site on the nonpolar substrate; and
   (b) creating a taper in the nonpolar substrate at said site by exposing the erodible material to conditions which erode both the erodible material and a portion of the nonpolar substrate.

2. The method of claim 1 where the nonpolar substrate is selected from the group consisting of silicon and germanium.

3. The method of claim 1 where the erodible material is selected from the group consisting of photoresist and photo-definable polyimide.

4. The method of claim 1 where the taper is provided by exposing the erodible material to energy, where there is a variation in the energy incident upon the surface of the erodible material.

5. The method of claim 4 where the energy variation is obtained using a halftone photomask.

6. The method of claim 4 where the energy variation is obtained using a photomask with a linearly graded region.

7. The method of claim 4 where the energy variation is obtained using the scanned slit method.

8. The method of claim 4 where the energy variation is obtained using the E-beam lithography.

9. The method of claim 1 where the taper is created in the silicon wafer by an etching method.

10. The method of claim 9 where the etching method is selected from the group consisting of reactive ion etching, plasma ion etching, ion milling and wet chemical etching.

11. The method of claim 2 where the taper created in silicon substrate is about $\frac{1}{2}°$ to 5° relative to standard <100> silicon.

12. The method of claim 2 where the taper created in silicon substrate is about 6° to 8° relative to standard <100> silicon.

13. The method of claim 2 where the taper created in silicon substrate is about $\frac{1}{2}°$ to 8° relative to standard <100> silicon.

14. The method of claim 1 where there is at least a first and second growth site and the angle of the taper of said first site is different from the angle of the taper of said second site.

15. A method of preparing a nonpolar substrate for the growth of polar semiconductors comprising the steps of:
   (a) applying a layer of photoresist to a site on the nonpolar substrate;
   (b) exposing the photoresist, at the site, to radiation which has an energy variation at the photoresist surface; and
   (c) etching the photoresist and nonpolar substrate at the site so that an angled surface is created in said nonpolar substrate at said site.

16. The method of claim 15 where the nonpolar substrate is a silicon wafer.

17. The method of claim 15 where the nonpolar substrate is a germanium wafer.

18. The method of claim 15 where the radiation is ultraviolet light.

19. The method of claim 15 where the energy variation at the surface of the photoresist is created using a halftone photomask.

20. The method of claim 15 where the energy variation at the surface of the photoresist is created by using a photomask with a linearly graded region.

21. The method of claim 15 where the energy variation at the surface of the photoresist is created using the scanned slit method.

22. The method of claim 15 where the energy variation is obtained using the E-beam lithography.

23. The method of claim 15 where the photoresist and nonpolar substrate are etched using a reactive ion etcher.

24. The method of claim 15 where the angled surface created in the nonpolar substrate is about $\frac{1}{2}°$ to 5° relative to standard orientation nonpolar substrate.

25. The method of claim 15 where the angled surface created in the silicon is about 6° to 8° to standard orientation nonpolar substrate.

26. The method of claim 15, where the angled surface created in the silicon is about $\frac{1}{2}°$ to 8° relative to standard orientation nonpolar substrate.

27. The method of claim 15 where a first and second angled surface on the nonpolar substrate do not have the same angle relative to unetched substrate.

28. A method of treating the surface of a nonpolar substrate comprising forming a taper at at least a first site by exposing said first site to conditions which erode the nonpolar substrate in a linearly varying manner.

29. The method of claim 28 where the angle of the taper formed at said first site is different from the angle of the taper formed at at least one other site.

30. The method of claim 28 where the nonpolar substrate is selected from the group consisting of silicon and germanium.

31. The method of claim 29 where the angle of the taper formed at said at least first site is about $\frac{1}{2}°$ to 8°.

32. A method for obtaining an off-axis site for the growth of compound semiconductor material on a standard orientation silicon wafer where a silicon electronic device is present on the wafer, comprising the steps of:
  (a) eroding a dielectric film on the wafer down to the silicon at said site;
  (b) applying a layer of erodible material at said site;
  (c) exposing the erodible material to radiation which has an energy variation at the surface of the erodible material; and
  (d) forming a taper in the silicon wafer at said site by exposing the wafer to conditions which erode both the erodible layer and a portion of the silicon.

33. The method of claim 32 where the electrical device is selected from the group consisting of MOS transistors, bipolar transistors, or heterojunction bipolar transistors.

34. The method of claim 32 where the silicon electronic device is unmetallized.

35. The method of claim 32 where the dielectric film on the silicon wafer is eroded by an etching process.

36. The method of claim 32 where the energy variation at the surface of the erodible layer is obtained by using a halftone photomask.

37. The method of claim 32 where the energy variation at the surface of the erodible layer is obtained by using a photomask with a linearly graded region.

38. The method of claim 32 where the energy variation at the surface of the erodible layer is obtained by using the scanned slit method.

39. The method of claim 32 where the energy variation at the surface of the erodible layer is obtained using the E-beam lithography.

40. The method of claim 32 where the taper in the silicon surface is about 3° relative to standard orientation silicon.

41. The method of claim 32 where the taper in the silicon surface ranges from about $\frac{1}{2}°$ to 8° relative to standard orientation silicon.

42. A method for growing polar semiconductors on a nonpolar substrate comprising the steps of:
  (a) preparing the substrate surface for growth by providing a first region of the substrate having a standard orientation for implementation of a silicon electronic device and providing at least a second region having an off-axis orientation; and
  (b) forming a polar semiconductor at said at least second region.

43. The method of claim 42 where the off-axis region has an angle of taper of from about $\frac{1}{2}°$ to 8° relative to the region having a standard orientation.

44. The method of claim 42 where the polar semiconductor is selected from the group consisting of III–V semiconductors and II–IV semiconductors.

45. The method of claim 42 where the polar semiconductor is gallium arsenide and the nonpolar substrate is <100> silicon.

46. The method of claim 42 where the angle of the off-axis orientation of said second region is different from the angle of the off-axis orientation of a third region.

47. The method of claim 46 where a first polar semiconductor is formed at said second region and a second polar semiconductor is formed at said third region, where said first and second polar semiconductors have a different composition.

* * * * *